(12) United States Patent
Kishimoto et al.

(10) Patent No.: US 7,722,738 B2
(45) Date of Patent: May 25, 2010

(54) SEMICONDUCTOR DEVICE MANUFACTURING UNIT AND SEMICONDUCTOR DEVICE MANUFACTURING METHOD

(75) Inventors: Katsushi Kishimoto, Soraku-gun (JP); Yusuke Fukuoka, Ikoma-gun (JP); Yasushi Fujioka, Soraku-gun (JP); Hiroyuki Fukuda, Shiki-gun (JP); Katsuhiko Nomoto, Kashiwara (JP)

(73) Assignee: Sharp Kabushiki Kaisha, Osaka (JP)

( * ) Notice: Subject to any disclaimer, the term of this patent is extended or adjusted under 35 U.S.C. 154(b) by 59 days.

(21) Appl. No.: 10/704,129

(22) Filed: Nov. 10, 2003

(65) Prior Publication Data

US 2004/0113287 A1 Jun. 17, 2004

(30) Foreign Application Priority Data

Nov. 12, 2002 (JP) ............................. 2002-328459
Aug. 29, 2003 (JP) ............................. 2003-209716

(51) Int. Cl.
*C23F 1/00* (2006.01)
*H01L 21/306* (2006.01)
*C23C 16/00* (2006.01)

(52) U.S. Cl. ............................. 156/345.47; 118/723 E
(58) Field of Classification Search ................ 118/715, 118/722, 723 E; 156/345.43, 345.45
See application file for complete search history.

(56) References Cited

U.S. PATENT DOCUMENTS 3,471,734 A * 10/1969 Rich ........................... 313/603
4,289,598 A * 9/1981 Engle ..................... 204/192.32
4,328,081 A * 5/1982 Fazlin .................... 204/192.32
5,039,376 A * 8/1991 Zukotynski et al. ........... 216/71
5,232,508 A * 8/1993 Arena et al. ................. 118/719

(Continued)

FOREIGN PATENT DOCUMENTS

JP 3-41847 4/1991

(Continued)

OTHER PUBLICATIONS

English translation of JP 08-306670 A (published Nov. 22, 1996).*

(Continued)

*Primary Examiner*—Parviz Hassanzadeh
*Assistant Examiner*—Maureen Gramaglia
(74) *Attorney, Agent, or Firm*—Nixon & Vanderhye P.C.

(57) ABSTRACT

A semiconductor device manufacturing unit is provided, wherein a cathode and an anode can be placed in a simple structure; wherein excellent film deposition and film thickness distribution can be gained; and wherein no cooling devices are required to be provided.

A chamber 11 is formed so that the inside thereof can be controlled at a vacuum of an arbitrary degree. Anode supports 6 for supporting an anode 4 are placed at the bottom of the internal structure 8. The anode 4 is made of a material having a high electrical conductivity and a high heat resistance. The temperature of the anode 4 is controlled by a heater 24 so as to be in a range of from room temperature to 600° C. A cathode 2 is placed on a cathode support 5 so as to face the anode 4. The cathode support 5 is attached to an internal structure 8 made of a frame in a rectangular prism form provided within the chamber 11.

3 Claims, 5 Drawing Sheets

U.S. PATENT DOCUMENTS

| | | | | |
|---|---|---|---|---|
| 5,234,527 | A | * | 8/1993 | Nozawa et al. ......... 156/345.27 |
| 5,542,559 | A | * | 8/1996 | Kawakami et al. ............ 216/67 |
| 5,766,364 | A | * | 6/1998 | Ishida et al. ................ 118/725 |
| 6,485,604 | B1 | * | 11/2002 | Okayama et al. ....... 156/345.47 |

FOREIGN PATENT DOCUMENTS

| | | |
|---|---|---|
| JP | 05-160027 | 6/1993 |
| JP | 05-283343 | 10/1993 |
| JP | 08306670 A * | 11/1996 |
| JP | 09-266201 | 10/1997 |
| JP | 2002-270527 | 9/2002 |
| JP | 2002-531695 | 9/2002 |
| WO | WO 02/41672 A1 * | 5/2002 |

OTHER PUBLICATIONS

Partial Translation of Publication No. HEI 3-41847.
Translation of Office Action for JP Application No. 2007-77062 dated Nov. 25, 2008.

* cited by examiner

(Prior Art)

FIG. 5

SEMICONDUCTOR DEVICE MANUFACTURING UNIT AND SEMICONDUCTOR DEVICE MANUFACTURING METHOD

CROSS-REFERENCE TO RELATED APPLICATION

This application is related to Japanese application No. 2002-328459 filed on Nov. 12, 2002 and Japanese application No. 2003-209716 filed on Aug. 29, 2003, whose priorities are claimed under 35 USC §119, the disclosures of which are incorporated by reference in their entirety.

BACKGROUND OF THE INVENTION

1. Field of the Invention

The present intention relates to a semiconductor device manufacturing unit and a semiconductor device manufactured by using the same, in particular, relates to a semiconductor device manufacturing unit characterized by the internal structure which is used to manufacture a semiconductor device by carrying out etching and film formation on a substrate by means of a plasma discharge of a reactive gas as well as a semiconductor device manufactured by using this semiconductor device manufacturing unit.

2. Description of the Related Art

There is a plasma reactive unit wherein the uniformity of etching and film formation is improved in a plasma chemical technology as a conventional semiconductor device manufacturing unit (for example, see Patent Reference 1).

[Patent Reference 1] Japanese Unexamined Patent Publication 2002-270527

Figure 4:
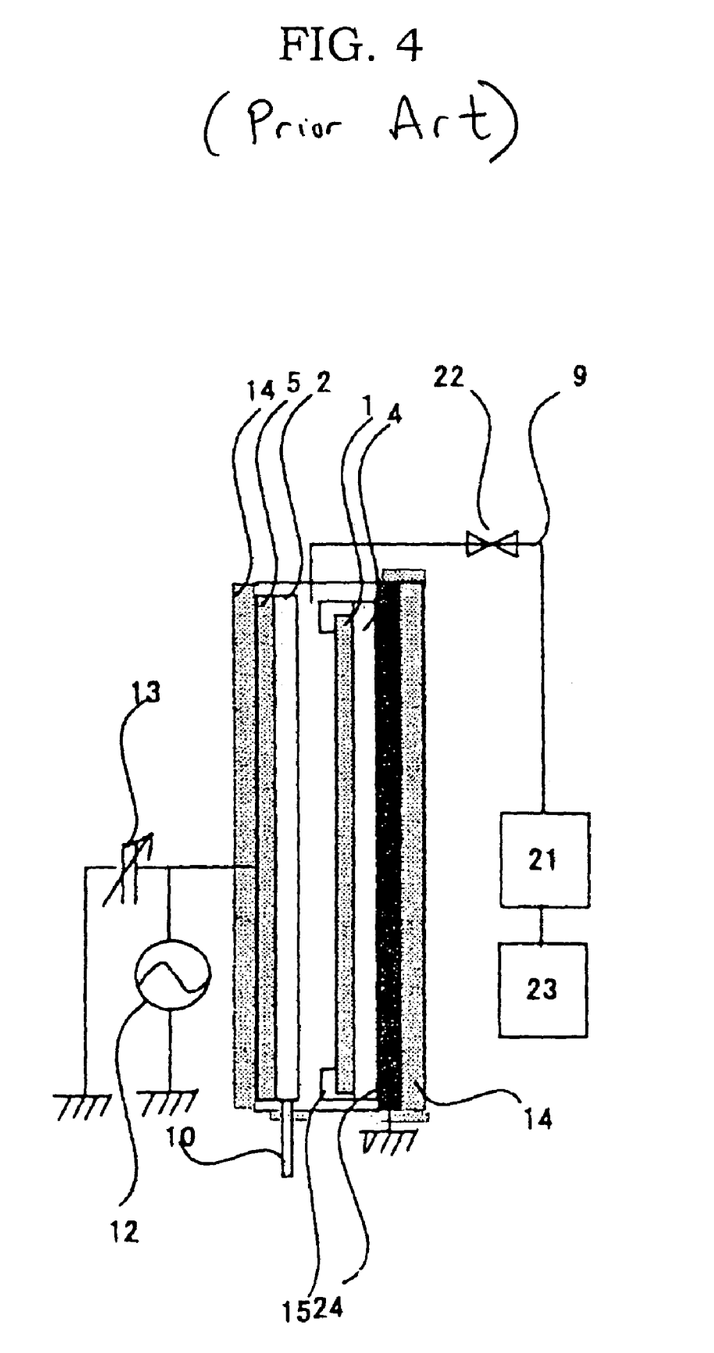
FIG. 4 is a schematic diagram of a longitudinal cross section showing a semiconductor device manufacturing unit according to the prior art.

As described in Patent Reference 1 a vertical type semiconductor device manufacturing unit as shown in FIG. 4 is known as a conventional general semiconductor device manufacturing unit.

A cathode 2, an anode 4 and a heater 24 for heating a substrate are fixed as structures to walls of a chamber that is subjected to the influence of external atmosphere in this semiconductor device manufacturing unit. The cathode 2 and the anode 4 make a plasma discharge occur and form walls of the chamber.

A structure made of an insulator is provided between the above described structures and the cathode 2 in an intervening form. Thus, this structure supports the cathode 2 and the anode 4 against the walls of the chamber.

An exhaust outlet is provided in the direction of one side around the periphery of the plasma discharge region formed between the cathode 2 and the anode 4. A cooling part 14 is provided to the lower portion of the cathode 2 and on the wall of the chamber. A glass substrate 1, which is an object to be processed, is fixed to a holder and the outer periphery of this holder is secured to the chamber walls.

Furthermore, the entirety of the chamber is formed of an aluminum alloy and the vacuum sealed portion of the cathode 2 and the vacuum sealed portion of a heater 24 which are effected by reactive radicals are covered with fluorine based rubber sealing material such as Kalrez in the case wherein an etching gas is utilized as a reactive gas.

Such a semiconductor device manufacturing unit is described below more concretely. That is to say a chamber is prepared as a reactive vessel and the anode 4 is placed inside thereof. The anode 4 makes contact with the heater 24 for heating the glass substrate 1, which is an object to be processed, to a constant temperature, for example 100° C. to 600° C.

Stainless steel, aluminum alloy or the like is utilized for the chamber and the anode 4, and ceramics or the like is utilized as a heat insulating material. Furthermore, the cathode 2 is placed so as to face the substrate 1 and this cathode 2 is supported by a cathode support 5 made of an insulator so as to be electrically insulated from the surrounding.

Here, it is necessary to set the interval between the cathode 2 and the anode 4 with a high precision in order to form a film with a uniform film thickness and film quality. Therefore, the cathode 2 is fixed by screwing peripheral portions thereof at regular intervals.

Stainless steel, aluminum alloy or the like is utilized as the material of the cathode 2. In addition, a great number of micro through holes are created in the surface of the cathode 2 facing the substrate 1 by means of piercing processing. The reactive gas supplied from a reactive gas introducing pipe 10 can be uniformly supplied to the surface of the substrate 1 by means of these through holes.

The substrate 1 is supported by a substrate support 15 in a stable manner and is placed on the surface of the anode 4 in the case of such a vertical type semiconductor device manufacturing unit. The cooling part 14 is placed outside of the heater 24 in order to restrict an increase of temperature in the chamber or of the vacuum sealing portions. This is because rubber sealing material such as Viton and Kalrez is used for the vacuum sealing portions and it is particularly necessary to cool these portions sufficiently.

An exhaust pipe 9 used for discharge space, a pressure controller 22 and a vacuum pump 21 are provided in order to freely control the pressure of the reactive gas within the chamber. A harm abatement device 23 for removing harmful substance from the exhaust gas is connected to the vacuum pump 21. In addition, a plasma exciting power supply 12, which is a power supply of high frequency and an impedance matching device 13 are provided in order to supply power of high frequency to the cathode 2.

Such a configuration makes a glow discharge occur between the cathode 2 and the anode 4 under the condition wherein the pressure of the reactive gas is controlled so that an amorphous film or a crystal film is formed on the substrate 1.

Several problems as described below arise with the conventional semiconductor device manufacturing unit described above.

The cathode 2, the anode 4 and the heater 24 for heating a substrate are fixed to the walls of the chamber causing an increase in thermal conduction to the outside and therefore a grounding and a cooling device (the cooling part 14) for the sealing portions become necessary. In addition, the cathode 2 is used as a wall of the chamber that is affected by the external atmosphere even though the cathode itself is required to be highly insulated and therefore, the cathode 2 becomes the large structure, and parts thereof become expensive and it becomes necessary to cool the cathode from the rear side by means of the cooling part 14. The heater 24 is also connected to a wall of the chamber and therefore, it becomes necessary to cool this connection portion.

Though the cathode 2 is supported by a wall of the chamber via a structure made of an insulator, it is difficult to secure the distance for grounding of this wall against the introduction of power and therefore, the plasma discharge is also easily affected by this wall. Though it is necessary to place the chamber wall as far away as possible from the cathode 2 in order to restrict such an influence to the minimum, such an implementation directly causes an increase in size of the chamber and therefore becomes a factor in the increase of cost.

In addition, the cathode 2 which is a structure of large scale must prevent leakage of the reactive gas in addition to secure of an electric insulation vis-à-vis the chamber wall and therefore vacuum sealing parts of a large scale become necessary leading to a great increase of cost.

Furthermore, though a rubber sealing material such as Viton or Karlez is used for the vacuum sealing portions in the case wherein a fluorine based etching gas is utilized as the reactive gas, effects of fluorine radicals are inevitable to the sealing portions of the cathode 2 and the anode 4 in the vicinity of the plasma discharge region and therefore, an expensive Karlez must be used.

In addition, an exhaust outlet is provided for only the direction of one side in the surrounding of the plasma discharge region and therefore, the conductance of the reactive gas is reduced, thereby making it difficult to replace a large amount of gas.

Moreover, the plasma discharge region is limited to one side of the front because power is introduced from the rear side. In addition, a problem with an insufficient grounding arises in the case of a vertical type substrate setting wherein the surrounding of the substrate 1 is fixed.

The present invention is provided in view of such circumstances and an object thereof is to provide a semiconductor device manufacturing unit wherein a cathode and an anode can be placed in a simple structure, wherein excellent film deposition and film thickness distribution can be gained and no cooling device is required so that the entire structure of the unit is simplified and reduction of cost can be implemented as well as to provide a semiconductor device manufacturing method using such a unit.

SUMMARY OF THE INVENTION

One aspect of the present invention is to provide a semiconductor device manufacturing unit comprising: a chamber that can be sealed; an internal structure provided within this chamber so as to be separated from the walls of the chamber and having an internal space for containing a semiconductor device substrate, which is an object to be processed; reactive gas supply means for supplying a reactive gas to the internal space; a cathode and an anode for plasma discharging a reactive gas; and a heater for heating the semiconductor device substrate, wherein the cathode, the anode and the heater are supported by the internal structure.

The cathode and anode are supported so as to be separated from the walls of the chamber by means of the internal structure in this semiconductor device manufacturing unit and therefore, it becomes unnecessary to resist against the atmosphere so that the configuration can be simplified. In addition, the heater is separated from the chamber walls so as to suppress the thermal conduction to the outside and therefore, a cooling device for cooling the walls can be omitted. Furthermore, the internal structure which supports the cathode, the anode and the heater for heating substrate is provided so as to surround the discharged space within the chamber, wherein nothing else blocks the flow path of the reactive gas and therefore the conductance of the gas increases and it becomes possible to replace a large amount of gas.

The distance between the grounding portion such as outer walls and the cathode electrode can be sufficiently secured and therefore the plasma is not easily affected by the potential other than that of the anode electrode and the stability of discharge plasma increases.

In addition, the walls of the chamber and the discharge space can be separate and therefore, it becomes unnecessary to take into consideration corrosion resistance of the vacuum parts such as an O-ring used for vacuum sealing even when a corrosive gas such as fluorine is utilized and widely-used products such as Viton can be utilized.

Therefore, a cathode and an anode can be placed in the semiconductor device manufacturing unit having a simple structure according to the present invention, wherein an excellent film deposition and film thickness distribution can be gained and furthermore, no cooling device is required to be provided so that simplification of the entire structure of the unit can be implemented leading to reduction of cost.

DESCRIPTION OF THE PREFERRED EMBODIMENTS

It is preferred for the internal structure of the semiconductor device manufacturing unit according to the present invention to be configured of a frame in a rectangular prism form. In the case of such a configuration, flat sides of the frame in the rectangular prism form can be utilized to facilitate the assembly of the cathode and the anode in plate forms to the internal structure.

It is preferable for the internal structure to be attached to the chamber via support legs. In such a case, the thermal conduction between the internal structure and the walls of the chamber can be reduced. In addition, the internal structure is placed so as to be separated from the walls of the chamber and therefore the conductance of the reactive gas can be increased and it becomes possible to replace a large amount of gas.

It is preferable for the internal structure to support the cathode via an insulator. In such a case, it becomes possible to suppress the effect of the chamber walls on the cathode at the time of power introduction and therefore, it becomes easy to control the discharge space.

It is preferable for the internal structure to support the heater via an insulator. In such a case, it becomes possible to suppress the effect of the chamber walls on the heater at the time of power introduction and in addition, the potential control of the anode can be carried out and therefore, it becomes easy to control the discharge space.

It is preferable for such an insulator to be made of glass, alumina or zirconia. In such a case, a desired insulation can be secured with easily available material and comparatively inexpensive material.

It is preferable for the cathode to be in a plate form and to be configured such that the power supply is received from a surface other than the front and rear sides; that is to say from an end or from a side which forms the thickness. In the case where the cathode is configured in such a manner, the discharge from the front and rear sides can be effectively utilized through the introduction of power from a surface other than that of the front and rear sides.

It is preferable for the semiconductor device manufacturing unit according to the present invention to be formed such that one anode is placed facing each of the front and rear sides of one cathode wherein plasma discharge is carried out on both sides of the cathode. In the case of such a configuration, plasma discharge at two locations becomes possible for one cathode and therefore, semiconductor device can be manufactured at a higher processing efficiency and miniaturization of the entirety of the unit can be achieved.

A plurality of structures such as this can of course be provided in the same chamber so that an increase in the process efficiency can be achieved.

It is preferable for the semiconductor device manufacturing unit according to the present invention to further be provided with means to reduce the pressure in the space of the anode relative to the space between the electrodes within the internal structure. In such a case, the means for reducing the pressure allows the pressure in the space of the anode to be lower than the pressure in the space between the electrodes within the internal structure and therefore, it becomes easy to place a substrate on the surface of the anode by utilizing this pressure difference so that the support mechanism for supporting a substrate can be simplified.

Concretely, it is preferable for such a means for reducing the pressure to maintain the pressure in the inside space of the internal structure at 1 Torr to 100 Torr, that is to say 1/760 atmospheric pressure to 100/760 atmospheric pressure. This is because experiments revealed that it is appropriate to set the pressure in the inside space of the internal structure at a value within this range in order to place a substrate on the surface of the anode by utilizing the above described pressure difference.

When the substrate is placed on the surface of the anode by utilizing the above described pressure difference, it is preferable for the anode to be formed to have a box structure having a great number of through holes, wherein the above described heater is placed inside of this box structure and a space connected to the above described through holes is provided. In the case where the anode having such a configuration is used, the substrate can more easily be placed on the surface of the anode due to the great number of through holes.

It is preferable for the configuration to allow the substrate to be supported by the anode due to the pressure difference between the inside of the internal structure and the space within the anode. In the case of such a configuration, the substrate can more easily be placed on the surface of the anode due to the great number of through holes.

It is preferable for the semiconductor device manufacturing unit according to the present invention to be provided with two cathodes for one anode; to be provided with one cathode for two anodes; or to be provided with two or more pairs of anodes and cathodes. In the case where anodes and cathodes are provided in any of the above described three types of settings, it becomes possible to carry out predetermined processes on a large amount of substrates for a short time in comparison with the semiconductor device manufacturing unit having one anode and cathode pair, wherein one cathode is provided for one anode and therefore, manufacturing efficiency can be improved.

The semiconductor device manufacturing unit according to the present invention may generate plasma of a fluorine based etching gas. The rate of operation of the unit can be increased by generating plasma by means of a widely-used fluorine based etching gas such as $SF_6$, or $NF_3$ and therefore, it becomes possible to easily manufacture a desired semiconductor device at a low cost.

According to another aspect of the present invention, a semiconductor device manufacturing method using the semiconductor device manufacturing unit according to the first aspect of the present invention is provided. According to such a semiconductor device manufacturing method, a semiconductor device such as a solar battery wherein a semiconductor thin film or an optical thin film is used, a TFT and a photosensitive body can efficiently be gained at a low cost.

In the following the present invention is described in detail based on the three embodiments shown in the drawings. Here, the present invention is not limited to these embodiments.

Embodiment 1

Figure 1:
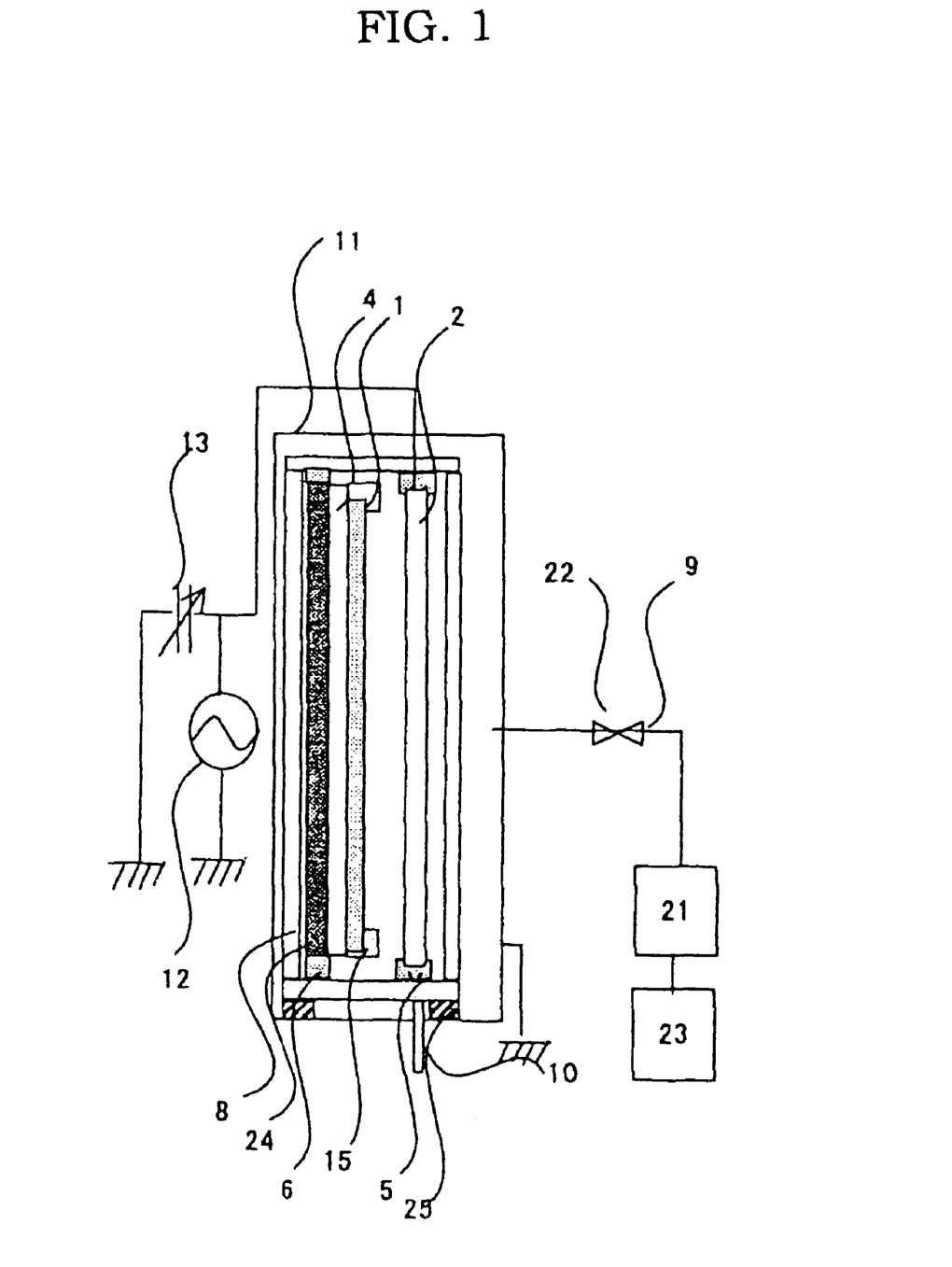
FIG. 1 is a schematic diagram of a longitudinal cross section showing a semiconductor device manufacturing unit according to Embodiment 1 of the present invention.

FIG. 1 is a schematic diagram of a longitudinal cross section showing the semiconductor device manufacturing unit according to Embodiment 1.

A chamber 11 is made of stainless steal, aluminum alloy, or the like. The engagement portion of the chamber 11 is completely sealed by means of an O-ring, or the like. An exhaust pipe 9, a pressure controller 22 and a vacuum pump 21 are connected to the chamber 11 so that the configuration allows the pressure within the chamber 11 to be controlled at a vacuum of an arbitrary degree. A harm abatement device 23 for removing harmful substance from the exhaust gas after the reaction of reactive gases introduced into the chamber 11 is connected to the vacuum pump 21.

Electrical support legs 25, which can sufficiently hold the weight of the structure to be supported, are connected to the chamber 11 and an internal structure 8 is connected to these support legs 25. A purpose of these support legs 25 is to spatially isolate the internal structure 8 in order to suppress the thermal conduction to the chamber 11 and, therefore, the longer the length thereof is the better and the smaller the areas for installation of these support legs are the better. Though the electrical support legs 25 are connected to the bottom of the chamber 11 in this embodiment, the positions of the connection may be on sides or on the top surface of the chamber 11 and are not particularly limited.

The internal structure is a structure having a strength that can support parts such as a cathode, an anode and a heater and it is preferable for the internal structure to have a structure in a frame form made of square bars or the like, taking into consideration the replacement efficiency of gases that are introduced into the inside. Here, the internal structure is not limited to this structure as long as it has strength that can support parts such as a cathode, an anode and a heater and it allows for an easy replacement of gases.

An anode 4 is made of a material having a high electrical conductivity and a high heat resistance such as stainless steal, aluminum alloy or carbon. The dimensions of the anode 4 are determined to have appropriate values according to the dimensions of a glass substrate 1 for the formation of a thin film. Here, the unit is designed so that the dimensions of the anode 4 become 1000 mm to 1500 mm×600 mm to 1000 mm when the dimensions of the substrate 1 are 900 mm to 1200 mm×400 mm to 900 mm.

The heater 24 is incorporated into the anode 4 so that the temperature of the anode 4 is controlled by this heater 24 so as to be in a range of from room temperature to 300° C. The anode 4 used herein is an anode wherein an enclosed heating device such as a sheath heater and an enclosed temperature sensor such as a thermocouple are incorporated into aluminum alloy and which is heated to a temperature ranging from room temperature to 300° C. in a controlled manner.

A gap of a constant measurement is provided between the bottom of the internal structure 8 and the lower surface of the anode 4 in order to suppress an increase in the temperature of the internal structure 8 due to the radiation heat from the anode 4. Here, this gap is set at 10 mm to 30 mm.

In addition, it is desirable for anode supports 6 to be made of a material having a small thermal conductivity in order to restrict an increase of temperature of the internal structure 8 due to the thermal conduction from the anode supports 6 and zirconia (zirconium oxide) is used herein.

Furthermore, it is desirable for the contact areas of the anode 4 and the anode supports 6 to be as small as possible in order to suppress the conveyance of heat from the anode 4 to the internal structure 8 due to thermal conduction of the anode supports 6. Here, the anode supports 6 are in forms so as to support four corners of the anode 4 and the dimensions of the supports are 30 mm×50 mm, wherein such support form and support dimensions are determined such that there are no risks of the anode 4 being warped.

Furthermore, mortises having a depth ranging from 1 mm to 5 mm are additionally provided in several places in the contact areas of the anode supports 6 and the anode 4 in order to restrict the conveyance of heat from the anode 4 to the internal structure 8 due to the thermal conductance of the anode supports 6.

The anode 4 is supported by the anode supports 6 placed at the four corners of the anode 4.

The anode 4 is connected to the chamber 11 by means of a ground lead in the case where it is necessary for the anode 4 to electrically be connected to the ground. Here, the ground lead is attached to the four corners of the anode 4 by using an aluminum plate having a width of 10 mm to 35 mm and a thickness of 0.5 mm to 3 mm. Incidentally, when the potential of the anode 4 is controlled, a DC power source may be directly connected to the anode 4.

The cathode 2 is made of stainless steal, aluminum alloy or the like. Here, aluminum alloy is utilized. The dimensions of the cathode 2 are set at appropriate values in accordance with the dimensions of the substrate 1 on which film formation is carried out and here the cathode 2 is designed to have dimensions of 1000 mm to 1500 mm×600 mm to 1000 mm.

The inside of the cathode 2 is hollowed. A reactive gas is introduced into this hollow through a reactive gas introducing pipe 10. Here, an $SiH_4$ gas diluted with $H_2$ is utilized as the reactive gas.

A great number of through holes for supplying a reactive gas to the space above the substrate 1 is created in the surface of the cathode 2 by means of piercing processing. It is desirable to carry out this piercing processing so as to create through holes having a diameter of from 0.1 mm to 2 mm with a pitch of from several mm to several cm.

The cathode 2 is installed on a cathode support 5 so as to face the anode 4. Electrical insulation is required for the cathode support 5 and strength sufficient for supporting the cathode 2 is also needed and, therefore, a material such as ceramics is utilized. Here, zirconia, alumina (aluminum oxide) or glass is utilized.

It is preferable for the distance between the cathode 2 and the anode 4 to be in a range of from several mm to several tens of mm and here the distance is set at a value in a range of from 2 mm to 30 mm. In addition, it is desirable for the precision of this distance to be several % or less and here it is confirmed to be 1% or less.

Here, though the cathode supports 5 are placed at the four corners of the cathode 2, one cathode support may be placed around the entire periphery of the cathode 2.

Though here the dimensions of the areas, where cathode supports 5 and the cathode 2 make contact with each other, are 100 mm×50 mm, the dimensions and arrangement of such areas are determined so as not to cause a warp in the cathode 2.

Cathode supports 5 are attached to the internal structure 8, which is a frame in a rectangular prism form provided within the chamber 11.

The plasma exciting power supply 12 is electrically connected to the cathode 2 via the impedance matching device 13 and, thereby, a power is supplied to the cathode 2. The plasma exciting power supply 12 supplies an AC power of from 10 W to 100 kW having a frequency of from 1.00 MHz to 108.48 MHz. Here, a power of from 10 W to 10 kW having a frequency of from 13.56 MHz to 54.24 MHz is utilized.

In the semiconductor device manufacturing unit formed as described above, a reactive gas is filled into the space between the cathode 2 and the anode 4 so as to have predetermined amount of flow and pressure, and a high frequency power is applied to the cathode 2 and the anode 4 so that a glow discharge region (plasma discharge region) is generated between the cathode 2 and the anode 4. Thus, an amorphous film or a crystal film can be formed on the substrate 1.

More concretely, an $SiH_4$ gas diluted with $H_2$ is utilized as the reactive gas and film formation is carried out for 10 minutes and, thereby, a silicon thin film can be deposited so as to have a film thickness of 300 nm within a film thickness distribution of ±10%.

In accordance with the semiconductor device manufacturing unit according to Embodiment 1 configured as described above, the cathode 2 and the anode 4 can be placed in a simple structure and it becomes possible to gain excellent film deposition and film thickness distribution in comparison with the prior art. In addition, the cathode 2 and the anode 4 can be placed in the internal structure so that it becomes unnecessary to provide a cooling device and, therefore, simplification of the unit structure can be implemented leading to reduction of cost.

In accordance with a semiconductor device manufacturing method using the semiconductor device manufacturing unit according to this Embodiment 1, a semiconductor device such as a solar cell, a TFT and a photo-sensitive body can efficiently be gained at a low cost.

Embodiment 2

Figure 2:
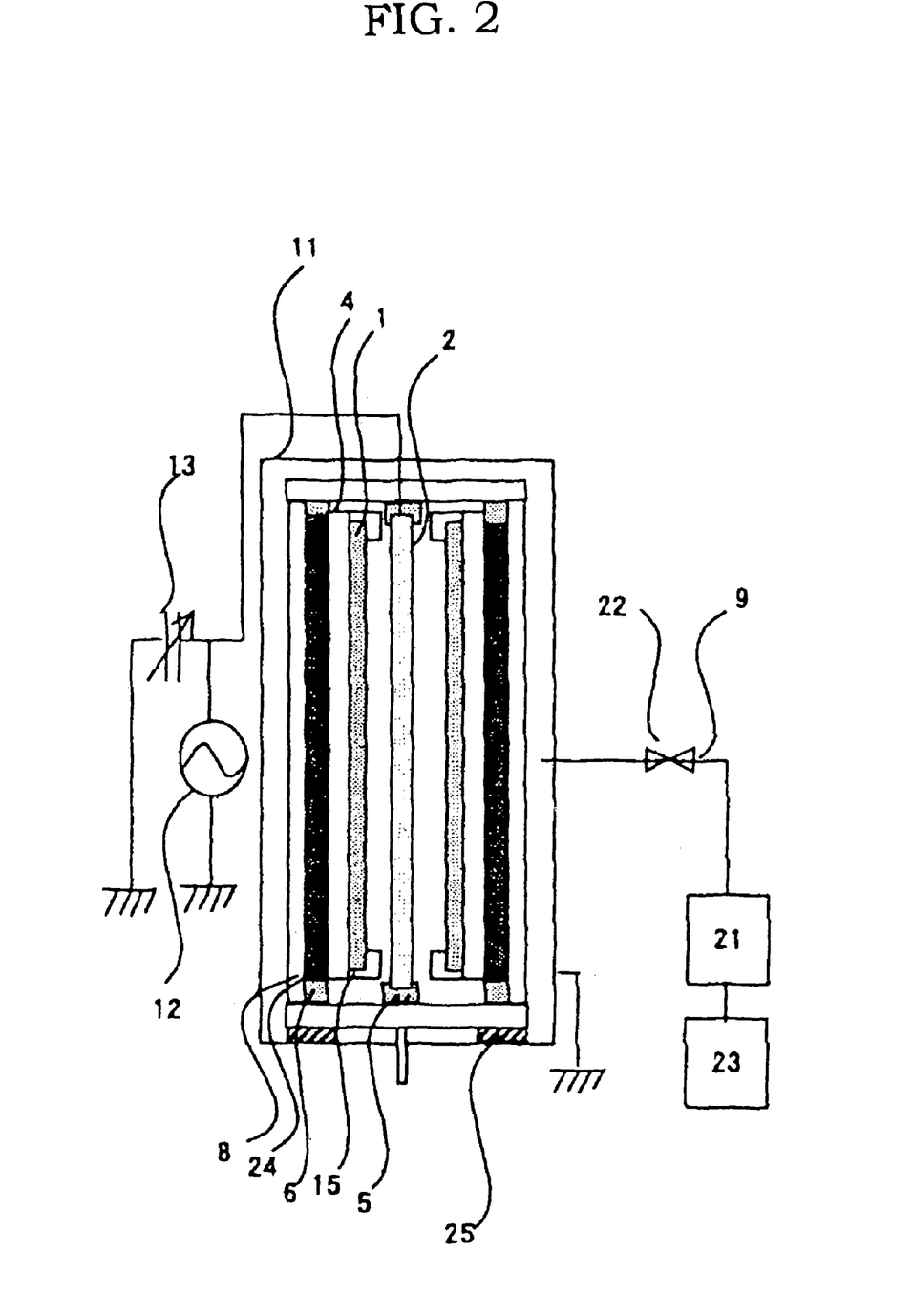
FIG. 2 is a schematic diagram of a longitudinal cross section showing a semiconductor device manufacturing unit according to Embodiment 2 of the present invention.

FIG. 2 is a schematic diagram of a longitudinal cross section showing a semiconductor device manufacturing unit according to Embodiment 2.

The same chamber 11 as of Embodiment 1 is used in this semiconductor device manufacturing unit and the anodes 4 are placed on both sides of one cathode 2 inside of this chamber 11. At this time a power is supplied from a surface other than the front and rear sides of the cathode 2; that is to say from an end or from a side which forms the thickness of the cathode 2. This semiconductor device manufacturing unit is isolated from the walls and, therefore, has a structure wherein the potential control of the anode 4 is easy. In this case film formation on a plurality of substrates, each being the same as the substrate 1, becomes possible.

In accordance with the semiconductor device manufacturing unit according to Embodiment 2 configured as described above, the same effects as the above described effects gained by the semiconductor device manufacturing unit according to Embodiment 1 can be gained and in addition, an increase in the throughput can be achieved.

Embodiment 3

Figure 3:
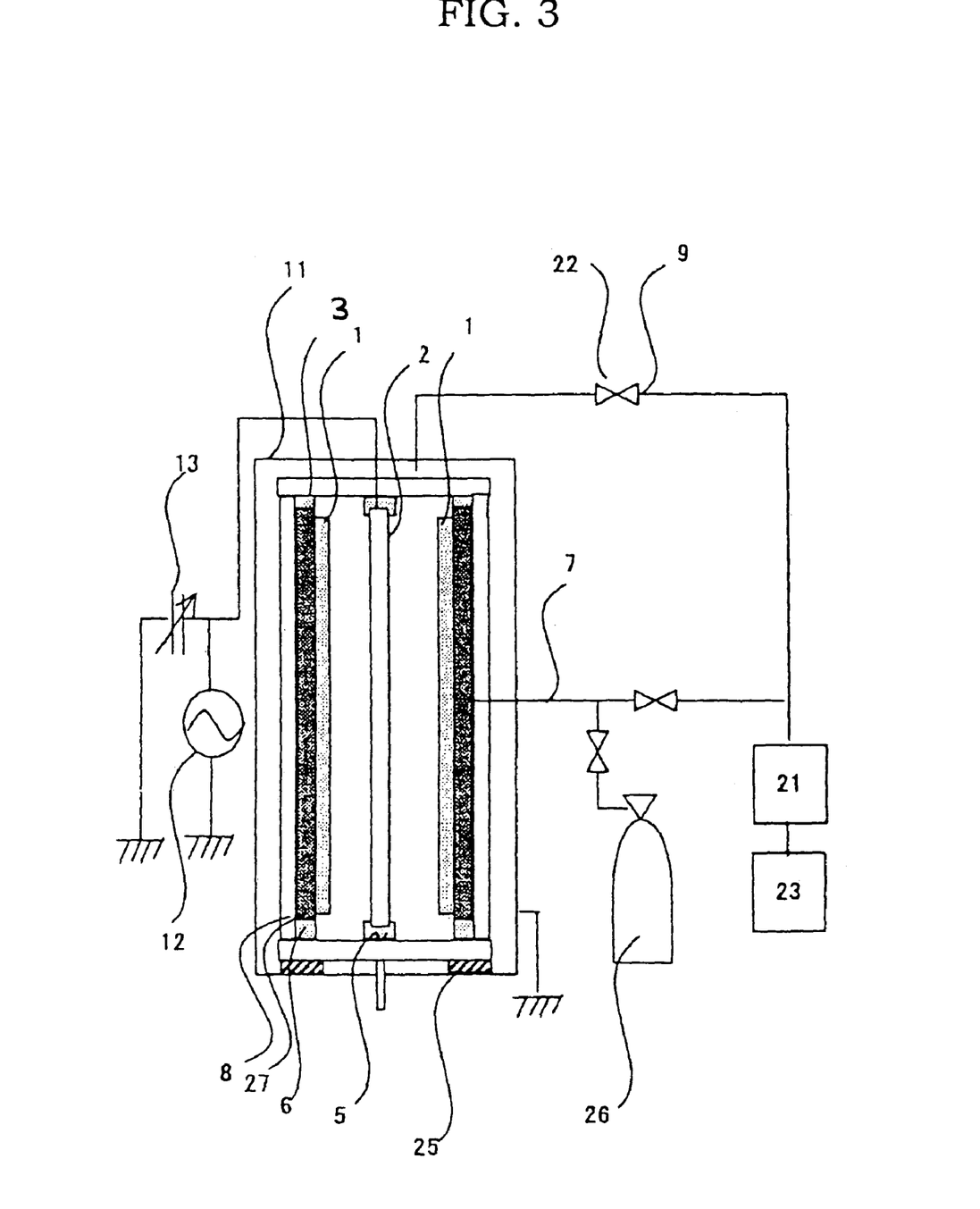
FIG. 3 is a schematic diagram of a longitudinal cross section showing a semiconductor device manufacturing unit according to Embodiment 3 of the present invention.

FIG. 3 is a schematic diagram of a longitudinal cross section of the semiconductor device manufacturing unit according to Embodiment 3.

Figure 5:
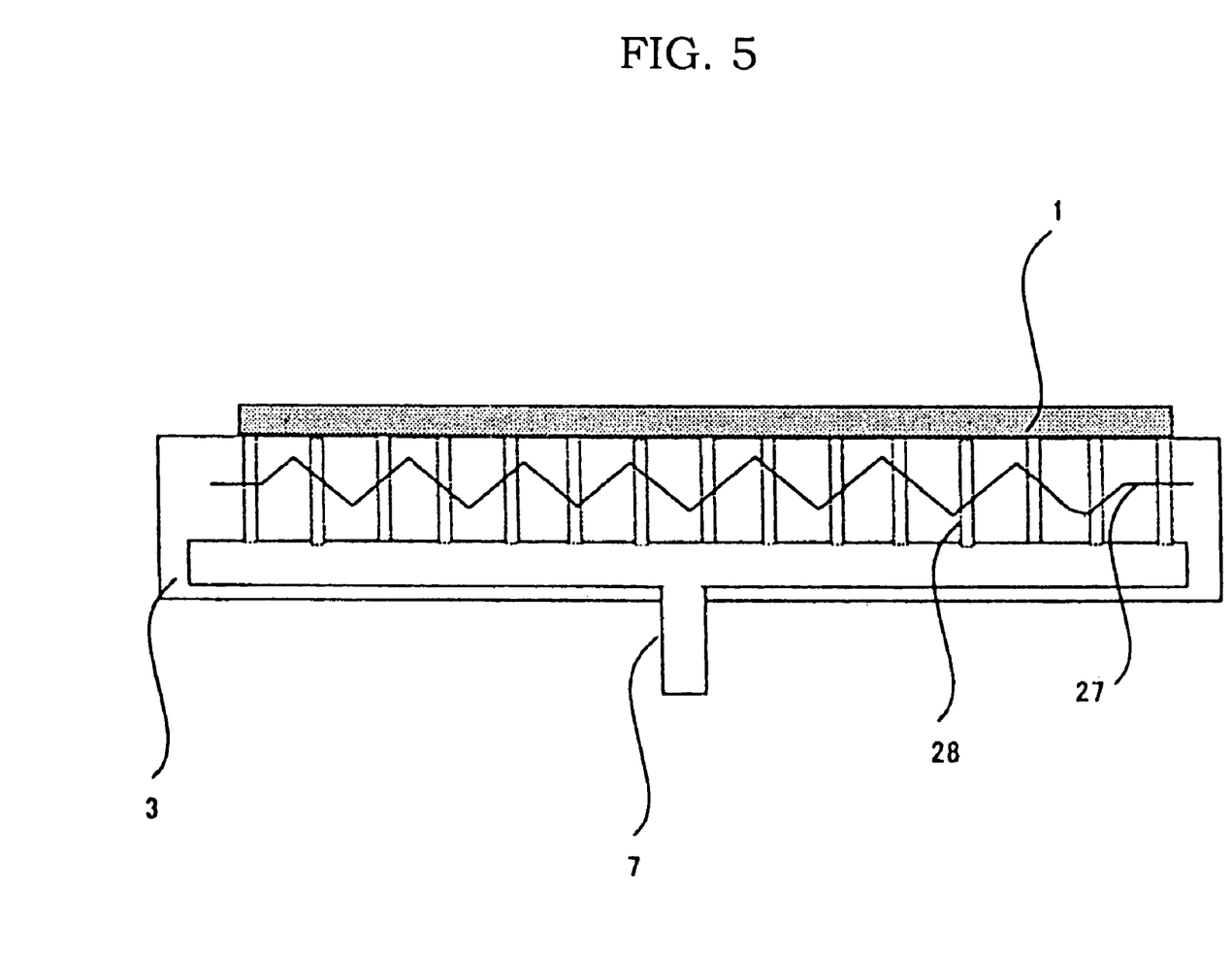
FIG. 5 is a schematic diagram of a longitudinal cross section showing anode 3 (box structure) of the semiconductor device manufacturing unit according to Embodiment 3 of the present invention.

In this semiconductor device manufacturing unit, an anode 3 is of a box structure having a great number of through holes 28 and having a heater 27 and a space as shown in FIG. 5. Thus, the heater 27 is incorporated into the anode 3. In addition, a mechanism is provided with an exhaust/inert gas introduction pipe 7 in the space within this anode 3, wherein a gas is expelled and introduced through this pipe 7 and, thereby, the substrate 1 is placed on, or removed from, the anode 3 in an appropriate manner.

Here, this mechanism utilizes a pressure difference in order to support the substrate 1 and, therefore, is appropriate for film formation with a pressure difference of 0.1 Torr or greater. Here, exhaust outlets are provided in two systems of the pipe 7 within the anode and an exhaust pipe 9 within the discharge space so that the pressure difference therebetween is utilized. At this time the pressure for film formation, density (distribution) of the through holes 28 in the anode 3 as well as the form and the size of the through holes can be arbitrarily set according to the weight of the substrate 1 to be supported.

In this semiconductor device manufacturing unit, the pressure for film formation is set at 1 Torr; the density (distribution) of the through holes 28 is set at $1/cm^2$; and as for the form and the size of the through holes 28 are made to be in a circular form having a diameter of 1 mm and, thereby, the glass substrate 1 having a thickness of 0.7 mm is supported.

In the semiconductor device manufacturing unit according to Embodiment 3 which is configured as described above, the glass surface of the substrate 1 is placed on, and is pressed with a uniform force, against the anode 3 and, therefore, the placement conditions are excellent and greatly contribute to an improvement in the distribution of the film thickness within the surface. In addition, the substrate supports 15, which may cause an uneven discharge, become unnecessary and can be removed and, therefore, the uniformity of discharge is increased.

Contrarily, the substrate 1 lifts off from the surface of the cathode so that placement and removal of the substrate 1 can easily be carried out in the case where the pressure in the chamber is reduced while the inside of the anode is converted to a high pressure condition in comparison with the inside of the chamber by introducing an inert gas 26 through the above pipe 7.

Other effects of the semiconductor device manufacturing unit according to Embodiment 3 are the same effects as described above gained by the semiconductor device manufacturing unit according to Embodiment 1.

Here, though the semiconductor device manufacturing units according to Embodiments 1 to 3 have configurations wherein the substrate 1, which is an object to be processed, is placed in the vertical direction and the cathode 2 is placed in parallel to the substrate 1, such an arrangement is not the essence of the present invention and can be changed according to the circumstances. No problem arises even in the case where the substrate is horizontally placed, for example, and no problem arises even in the case where the substrate is placed on the cathode.

What is claimed is:

1. A semiconductor device manufacturing unit comprising:
    a chamber that can be sealed;
    an internal structure provided within the chamber so as to be separated from the walls of the chamber and having an internal space for containing a semiconductor device substrate, which is an object to be processed, so that all walls of the chamber are spaced apart from the internal structure;
    reactive gas supply means for supplying a reactive gas to said internal space;
    a cathode and an anode for plasma discharging a reactive gas; and
    a heater for heating said semiconductor device substrate,
    wherein the cathode, the anode and the heater are supported by the internal structure, and wherein the internal structure is configured of a frame in a rectangular prism form, wherein flat sides of the frame in the rectangular prism form are configured to be utilized to facilitate the assembly of the cathode and the anode in plate forms to the internal structure, and wherein the heater is incorporated into the anode, and an empty heat insulating gap is provided between the internal structure and the heater for suppressing an increase in temperature of the internal structure due to radiation heat from the anode and/or heater, and
    wherein the heater is located adjacent the internal structure with the empty heat insulating gap located therebetween, so that no cathode or other anode is provided between the heater and the adjacent internal structure, and wherein the semiconductor device substrate is supported by and directly contacts the anode so that there is no gap between the anode and the substrate, whereby the empty heat insulating gap is located on a first side of the anode which is between the anode and the internal structure but no gap is provided on a side which is opposite to the first side of the anode.

2. The semiconductor device manufacturing unit of claim 1, further comprising a support leg connected to the chamber for suppressing a thermal conduction to the chamber.

3. The unit of claim 1, wherein the anode is electrically connected to ground at four positions.

\* \* \* \* \*